US007157929B1

(12) United States Patent
Kuo et al.

(10) Patent No.: US 7,157,929 B1
(45) Date of Patent: Jan. 2, 2007

(54) SYSTEM FOR TESTING FLAT PANEL DISPLAY DEVICES

(75) Inventors: Shih-Chung Kuo, Tainan County (TW); Makoto Huang, Kaohsiung (TW)

(73) Assignee: Hannspree, Inc, Taipei (TW)

(*) Notice: Subject to any disclaimer, the term of this patent is extended or adjusted under 35 U.S.C. 154(b) by 0 days.

(21) Appl. No.: 11/322,554

(22) Filed: Dec. 30, 2005

(30) Foreign Application Priority Data

Nov. 21, 2005 (TW) .............................. 94220128 U

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS 7,053,976 B1 * 5/2006 Hiroki ........................ 349/192
7,088,052 B1 * 8/2006 Kimura ................... 315/169.2

* cited by examiner

*Primary Examiner*—Jermele Hollington
*Assistant Examiner*—Trung Q Nguyen
(74) *Attorney, Agent, or Firm*—Schwegman, Lundberg, Woessner & Kluth P.A.

(57) ABSTRACT

A system for testing a flat panel display device includes a support plate and an electrical connector set. The support plate includes a plate body having a through hole, and is adapted to support the display device thereon such that a screen of the display device faces an upper surface of the plate body. The electrical connector set is mounted on the support plate, and is adapted to connect electrically with the display device on the support plate so as to enable activation of the display device to radiate light from the screen of the display device through the through hole. One of a light-directing component and an image-capturing unit is disposed under and is spaced apart from the support plate, to receive the light from the display device that passes through the through hole.

16 Claims, 4 Drawing Sheets

SYSTEM FOR TESTING FLAT PANEL DISPLAY DEVICES

CROSS-REFERENCE TO RELATED APPLICATION

This application claims priority of Taiwanese application no. 094220128, filed on Nov. 21, 2005.

BACKGROUND OF THE INVENTION

1. Field of the Invention

The invention relates to testing of display devices, more particularly to a system for testing flat panel display devices.

2. Description of the Related Art

As a result of ongoing advancements in display device technology, it is now possible to fabricate display devices for household use that have 40-inch display panels. However, with the increase in the size of display panels, the production of flat panel display devices, such as LCD televisions, plasma televisions, etc., has also become quite complex in view of high precision requirements in electrical connections between a display panel and associated electronic components. With the large size and heavy weight of display devices, at least two operators are required to accomplish some manual assembly tasks.

During fabrication and assembly of display devices, a display panel must be connected electrically to a circuit board to establish connection with other electronic components. When connecting to the circuit board, a screen of the display panel faces downwardly on the assembly table. Subsequently, when testing the assembled display device to verify its functionality, the assembled display device must be lifted so that the screen of the display panel is visible during a testing operation. Tested display devices that were found to be defective are further processed. It is noted that the act of lifting display devices during testing is not only labor intensive, but also slows down the production flow and increases the production cost.

SUMMARY OF THE INVENTION

Therefore, the object of the present invention is to provide a system for testing flat panel display devices that eliminates the need to lift the display devices during testing and that can facilitate subsequent troubleshooting of defective display devices.

According to one aspect of the present invention, there is provided a system for testing a flat panel display device. The system comprises a support plate, an electrical connector set, and a light-directing component. The support plate includes a plate body having upper and lower surfaces, and a through hole formed through the upper and lower surfaces. The support plate is adapted to support the display device thereon such that a screen of the display device faces the upper surface of the plate body. The electrical connector set is mounted on the support plate, and is adapted to connect electrically with the display device that is supported on the support plate, to enable activation of the display device to result in passage of light radiated from the screen of the display device through the through hole in the plate body. The light-directing component is disposed under and is spaced apart from the support plate, receives the light from the display device that passes through the through hole, and is capable of directing the light to an observer beside the system.

According to another aspect of the present invention, there is provided a system for testing a flat panel display device. The system comprises a support plate, an electrical connector set, and an image-capturing unit. The support plate includes a plate body having upper and lower surfaces, and a through hole formed through the upper and lower surfaces. The support plate is adapted to support the display device thereon such that a screen of the display device faces the upper surface of the plate body. The electrical connector set is mounted on the support plate, and is adapted to connect electrically with the display device that is supported on the support plate, to enable activation of the display device to result in passage of light radiated from the screen of the display device through the through hole in the plate body. The image-capturing unit is disposed under and is spaced apart from the support plate, and receives the light from the display device that passes through the through hole.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
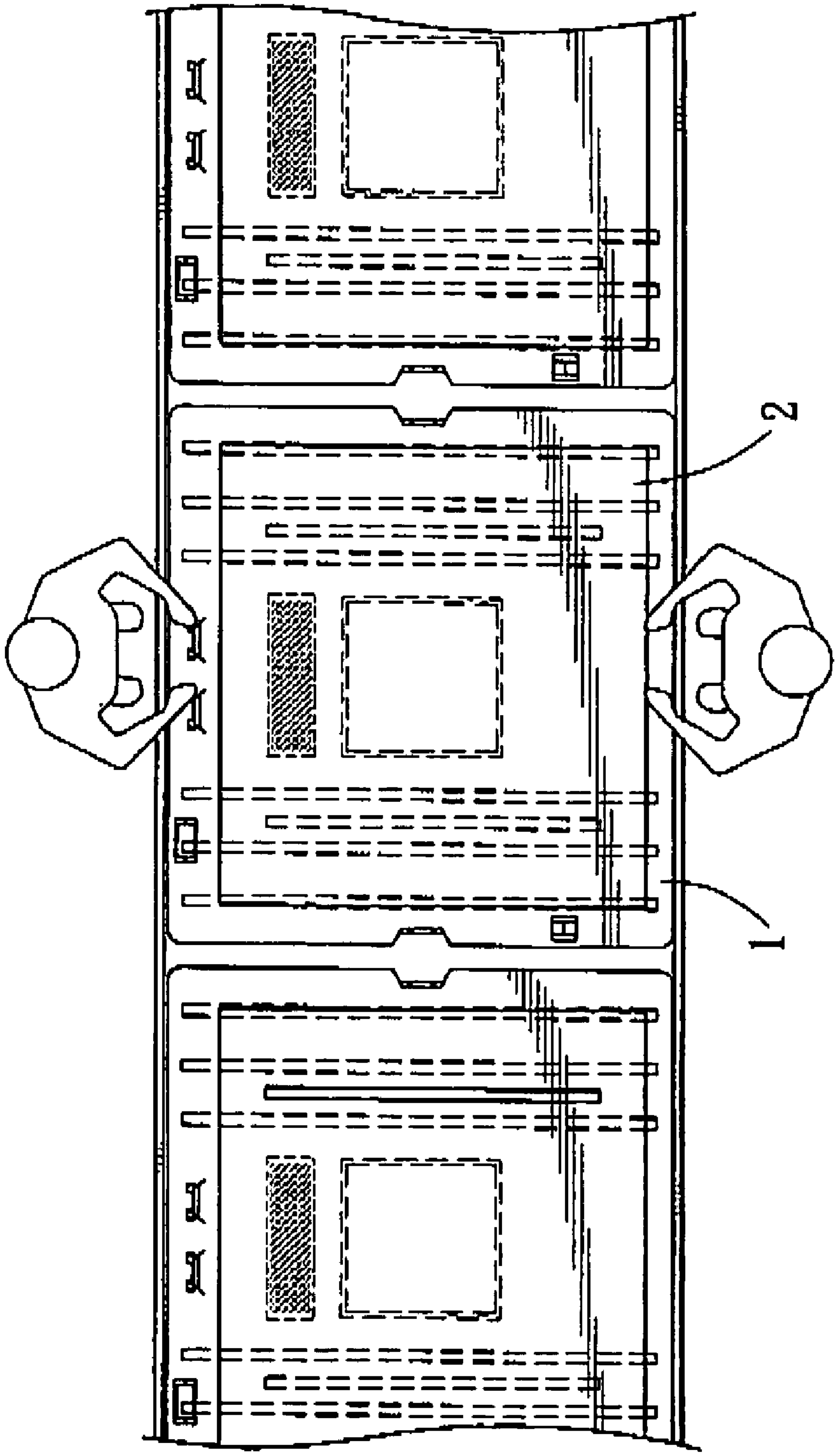
FIG. 1 is a schematic top view of the first preferred embodiment of a system for testing flat panel display devices according to the present invention.

Before the present invention is described in greater detail with reference to the accompanying preferred embodiments, it should be noted herein that like elements are denoted by the same reference numerals throughout the disclosure.

Figure 2:
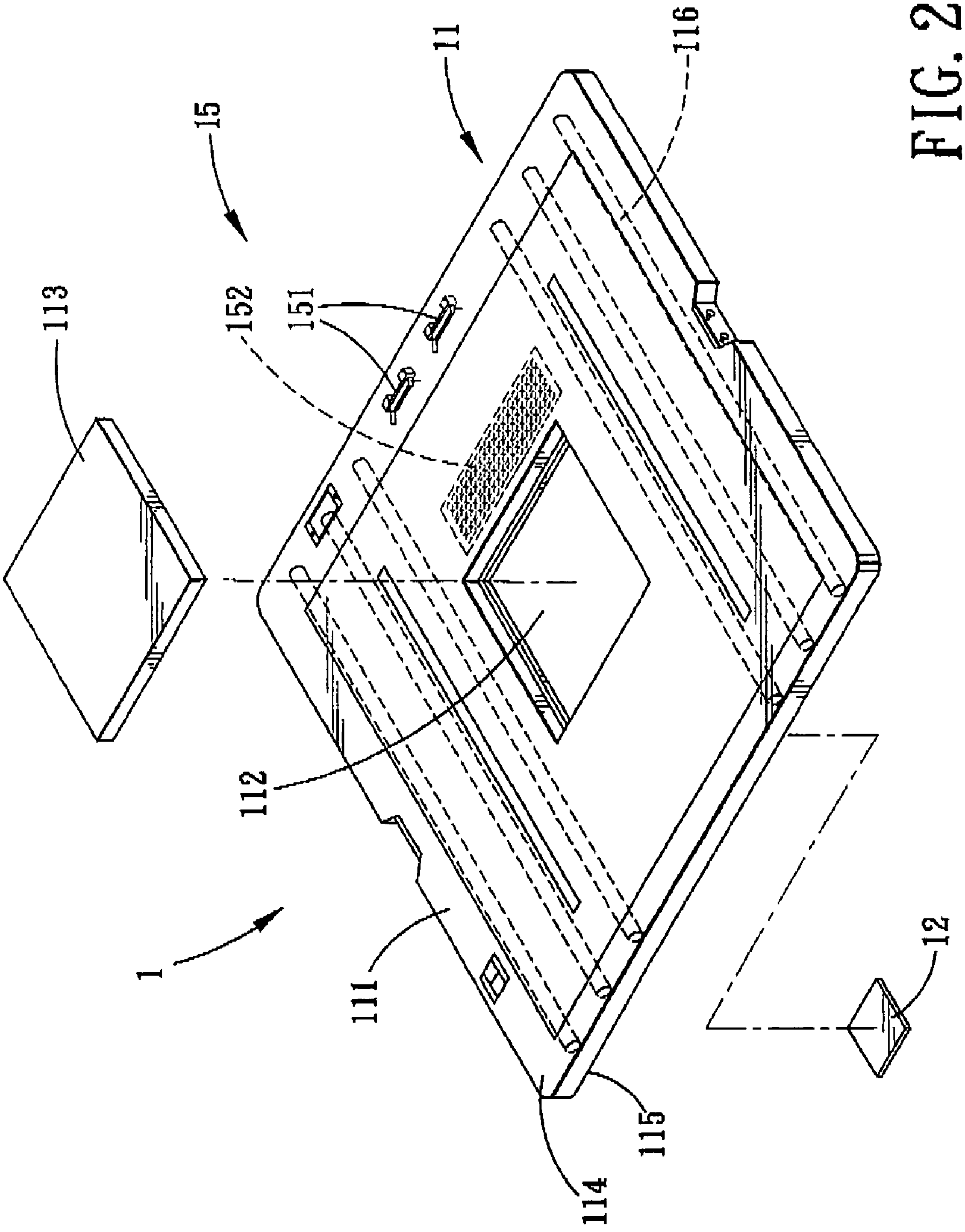
FIG. 2 is a fragmentary, partly exploded perspective view of the first preferred embodiment.
Figure 3:
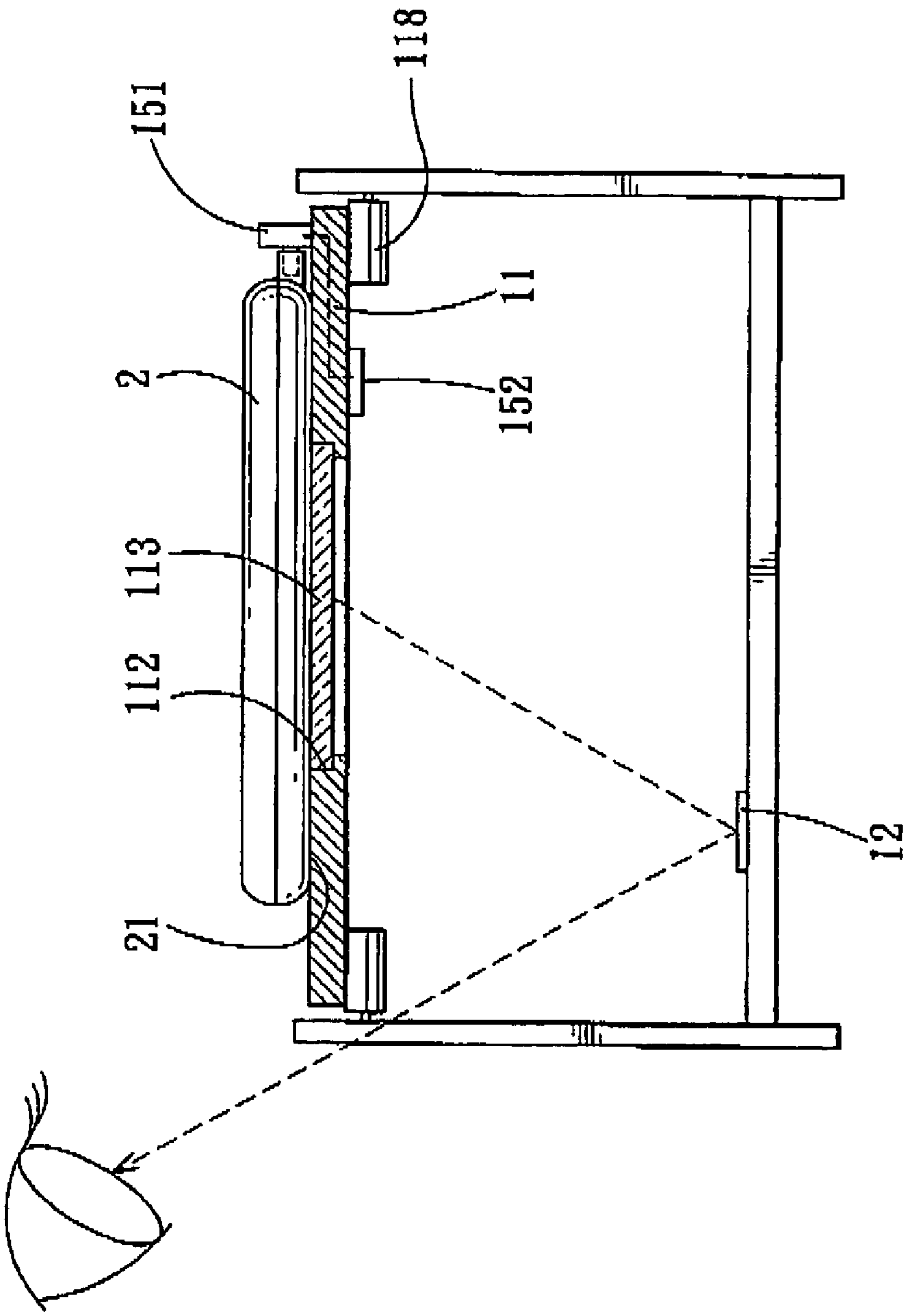
FIG. 3 is a partly sectional, schematic side view of the first preferred embodiment in a state of use.

Referring to FIG. 1, the first preferred embodiment of a system 1 according to the present invention is shown to be adapted for testing large size display devices 2, such as LCD televisions or plasma televisions. Referring to FIGS. 2 and 3, the system 1 is shown to comprise a support plate 11, an electrical connector set 15, and a light-directing component 12.

The support plate 11, which is a component assembly support plate used in component assembly operations, includes a plate body 111 having upper and lower surfaces 114, 115, and a through hole 112 formed through the upper and lower surfaces 114, 115. In use, the support plate 11 is adapted to support the display device 2 thereon such that a screen 21 of the display device 2 faces the upper surface 114 of the plate body 111.

Preferably, the system 1 further comprises a transparent lens component 113 mounted in the through hole 112 in the plate body 111 of the support plate 11, and a plurality of reinforcing ribs 116 mounted on the lower surface 115 of the plate body 111 of the support plate 11. In this embodiment, the plate body 111 of the support plate 11 is a rectangular plate made of engineering plastic such as PVC material. The through hole 112 is located at the center of the plate body 111 and is generally rectangular. In practice, the actual sizes of the plate body 111 and the through hole 112 may vary depending on the specifications of the display device 2, and buffer material, such as foam, may be placed on the plate body 111 to reduce vibrations and damages caused when conveying the support plate 11. In this embodiment, the transparent lens component 113 is made of glass but should not be limited thereto. In practice, any transparent material, such as acrylic, capable of light transmission through the through hole 112 may be used for the transparent lens component 113. In other embodiments of this invention, the transparent lens component 113 may even be dispensed with. Moreover, in this embodiment, the reinforcing ribs 116 are in the form of parallel metal bars that serve to enhance structural integrity of the plate body 111. The number and dimensions of the reinforcing ribs 116 may be varied to suit the actual weight of the display device 2, which can be as heavy as 50 kilos for a 42-inch display device. Therefore, by virtue of the reinforcing ribs 116, deformation of the support plate 11 due to the heavy weight of the display device 2 can be prevented.

The electrical connector set 15 is mounted on the support plate 11, and is adapted to connect electrically with the display device 2 that is supported on the support plate 11 so as to enable activation of the display device 2 to result in passage of light radiated from the screen 21 of the display device 2 through the through hole 112 in the plate body 111. In this embodiment, the electrical connector set 15 includes a first connector unit 151 mounted on the upper surface 114 of the plate body 111 of the support plate 11 and adapted to be connected electrically to the display device 2, and a second connector unit 152 mounted on the lower surface 115 of the plate body 111 of the support plate 11, connected electrically to the first connector unit 1511, and adapted to be connected electrically to an external test signal source (not shown). Therefore, a power signal, as well as audio and video test signals, can be supplied to the display device 2 via the first and second connector units 151, 152 of the electrical connector set 15. In this embodiment, the second connector unit 152 is an embedded-type 100-pin signal adapter.

In this embodiment, the light-directing component 12 is disposed under and is spaced apart from the support plate 11, receives the light from the display device 2 that passes through the through hole 112, and is capable of directing the light to an observer beside the system 1. Preferably, the light-directing component 12 includes a light reflector, which is a mirror in this embodiment.

Furthermore, as shown in FIG. 3, the system 1 further comprises a horizontal conveyor unit 118 for suspending the support plate 11 above the light-directing component 12.

When the system 1 is put into practice, a display device 2 is placed on the support plate 11 with the screen 21 facing the upper surface 114 of the plate body 111. A plurality of the support plates 11 may be conveyed in sequence by the horizontal conveyor unit 118. In addition, the system 1 can include only one light-directing component 12 that is disposed at a fixed testing location with respect to the horizontal conveyor unit 118. After operators on opposite lateral sides of a production line have completed assembly of a circuit board and associated electronic components on the display device 2, the assembled display device 2 is connected electrically to the electrical connector set 15 to enable activation of the display device 2, thereby resulting in passage of light radiated from the screen 21 of the display device 2 through the transparent lens component 113 in the through hole 112 in the plate body 111.

The light from the display device 2 that passes through the through hole 112 is received by the light-directing component 12 at the fixed testing location, and is subsequently directed to an observer beside the system 1 (as indicated by the dotted lines in FIG. 3) such that functionality of the assembled display device 2 can be verified immediately and conveniently without the need to lift the display device 2. Quality checks and repairs can then be conducted at once when the tested display device 2 is found to be defective.

By minimizing the need to move the display device 2 during assembling and testing, costs and production time can be reduced, and the risk of damage to the display device 2, such as internal and external damages due to impact and surface scratching, can also be reduced. Moreover, by mounting the relatively large size second connector unit 152 of the electrical connector set 15 on the lower surface 115 of the plate body 111 of the support plate 11, possible interference when moving the display device 2 onto and from the support plate 11 can be reduced, which can prevent damages and increase the production efficiency.

Figure 4:
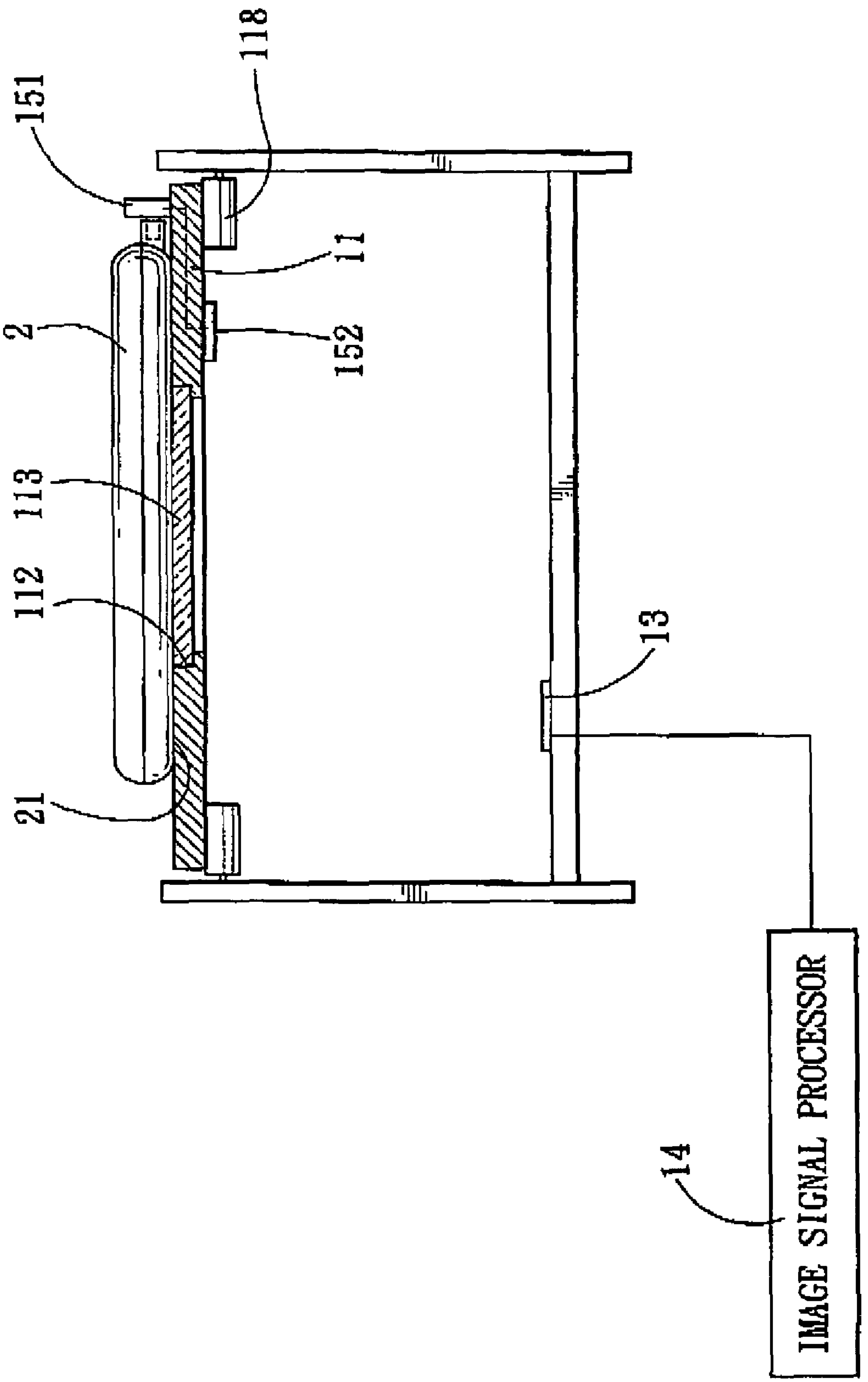
FIG. 4 is a partly sectional, schematic side view of the second preferred embodiment of a system for testing flat panel display devices according to the present invention.

Referring to FIG. 4, the second preferred embodiment of the system according to this invention is shown to be similar to the first preferred embodiment, the main difference residing in that the light-directing component 12 of the first preferred embodiment is replaced by an image-capturing unit 13 for receiving the light from the display device 2 that passes through the through hole 112 in the plate body 111 of the support plate 11. In this embodiment, the image-capturing unit 13 includes a charge-coupled device (CCD). An image signal processor 14 is coupled electrically to the image-capturing unit 13. Images captured by the image-capturing unit 13 are provided to the image signal processor 14 for subsequent inspection by an observer or for comparison with pre-established reference data.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A system for testing a flat panel display device, said system comprising:

a support plate including a plate body having upper and lower surfaces, and a through hole formed through said upper and lower surfaces, said support plate being adapted to support the display device thereon such that a screen of the display device faces said upper surface of said plate body;

an electrical connector set mounted on said support plate and adapted to connect electrically with the display device that is supported on said support plate so as to enable activation of the display device to result in passage of light radiated from the screen of the display device through said through hole; and a light-directing component disposed under and spaced apart from said support plate, said light-directing component receiving the light from the display device that passes through said through hole and being capable of directing the light to an observer beside said system.

2. The system as claimed in claim 1, further comprising a transparent lens component mounted in said through hole.

3. The system as claimed in claim 1, further comprising a plurality of reinforcing ribs mounted on said lower surface.

4. The system as claimed in claim 1, wherein said electrical connector set includes a first connector unit mounted on said upper surface and adapted to be connected electrically to the display device on said support plate.

5. The system as claimed in claim 4, wherein said electrical connector set further includes a second connector unit mounted on said lower surface, connected electrically to said first connector unit, and adapted to be connected electrically to an external test signal source.

6. The system as claimed in claim 1, wherein said light-directing component includes a light reflector.

7. The system as claimed in claim 6, wherein said light reflector is a mirror.

8. The system as claimed in claim 1, further comprising a horizontal conveyor unit for suspending said support plate above said light-directing component.

9. A system for testing a flat panel display device, said system comprising:

a support plate including a plate body having upper and lower surfaces, and a through hole formed through said upper and lower surfaces, said support plate being adapted to support the display device thereon such that a screen of the display device faces said upper surface of said plate body;

an electrical connector set mounted on said support plate and adapted to connect electrically with the display device that is supported on said support plate so as to enable activation of the display device to result in passage of light radiated from the screen of the display device through said through hole; and an image-capturing unit disposed under and spaced apart from said support plate, said image-capturing unit receiving the light from the display device that passes through said through hole.

10. The system as claimed in claim 9, further comprising a transparent lens component mounted in said through hole.

11. The system as claimed in claim 9, further comprising a plurality of reinforcing ribs mounted on said lower surface.

12. The system as claimed in claim 9, wherein said electrical connector set includes a first connector unit mounted on said upper surface and adapted to be connected electrically to the display device on said support plate.

13. The system as claimed in claim 12, wherein said electrical connector set further includes a second connector unit mounted on said lower surface, connected electrically to said first connector unit, and adapted to be connected electrically to an external test signal source.

14. The system as claimed in claim 9, wherein said image-capturing unit includes a charge-coupled device.

15. The system as claimed in claim 9, further comprising an image signal processor coupled to said image-capturing unit.

16. The system as claimed in claim 9, further comprising a horizontal conveyor unit for suspending said support plate above said image-capturing unit.

* * * * *